United States Patent [19]

Ewen et al.

[11] Patent Number: 4,694,261

[45] Date of Patent: Sep. 15, 1987

[54] INTEGRATED HIGH GAIN VOLTAGE CONTROLLED OSCILLATOR

[75] Inventors: John F. Ewen, Yorktown Heights, N.Y.; Joseph M. Mosley, Boca Raton, Fla.

[73] Assignee: International Business Machines Corporation, Armonk, N.Y.

[21] Appl. No.: 924,701

[22] Filed: Oct. 29, 1986

[51] Int. Cl.[4] .............................................. H03B 1/00
[52] U.S. Cl. ................................... 331/57; 331/108 C
[58] Field of Search ................. 331/57, 108 B, 108 C, 331/108 D, DIG. 3

[56] References Cited

U.S. PATENT DOCUMENTS

| | | | |
|---|---|---|---|
| 3,878,482 | 4/1975 | Schowe, Jr. | 331/108 D |
| 4,052,673 | 10/1977 | Herzog | 325/153 |
| 4,072,910 | 2/1978 | Dingwall et al. | 331/57 |
| 4,118,674 | 10/1978 | Ball | 331/17 |
| 4,131,861 | 12/1978 | Malaviya | 331/2 |
| 4,244,043 | 1/1981 | Fujita et al. | 368/85 |
| 4,255,722 | 3/1981 | Hochstrate | 331/113 R |
| 4,468,632 | 8/1984 | Crowley | 331/14 |
| 4,513,427 | 4/1985 | Boriello et al. | 375/110 |
| 4,517,532 | 5/1985 | Neidorff | 331/108 C X |
| 4,529,894 | 7/1985 | Chan et al. | 307/454 |

Primary Examiner—Eugene R. LaRoche
Assistant Examiner—Robert J. Pascal
Attorney, Agent, or Firm—Graham S. Jones, II

[57] ABSTRACT

A voltage controlled oscillator is formed of a plurality of cascaded inverter stages in a ring configuration. Each inverter stage is a grounded emitter circuit having an active pull-up stage in order to achieve a short stage delay. The frequency of the ring oscillator is determined by the number of inverter stages, and the gain is selectable by coupling an external control voltage to only certain of the inverters. The VCO may be fabricated on a single integrated circuit along with the other circuits necessary to form a phase locked loop or other frequency generation system.

10 Claims, 5 Drawing Figures

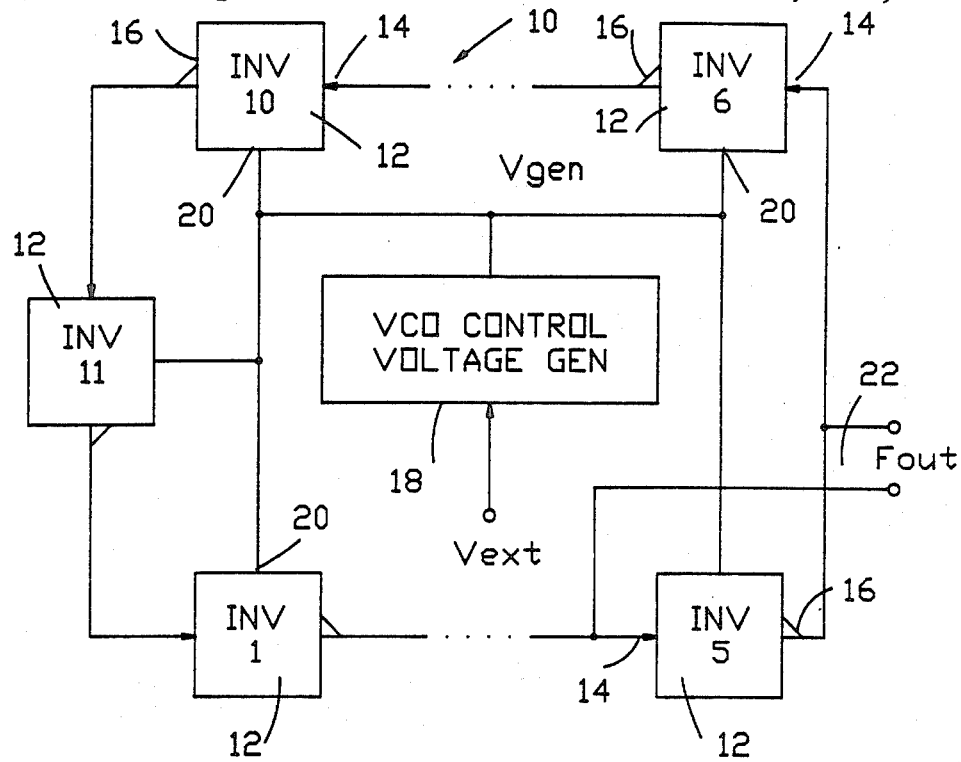
FIG.1
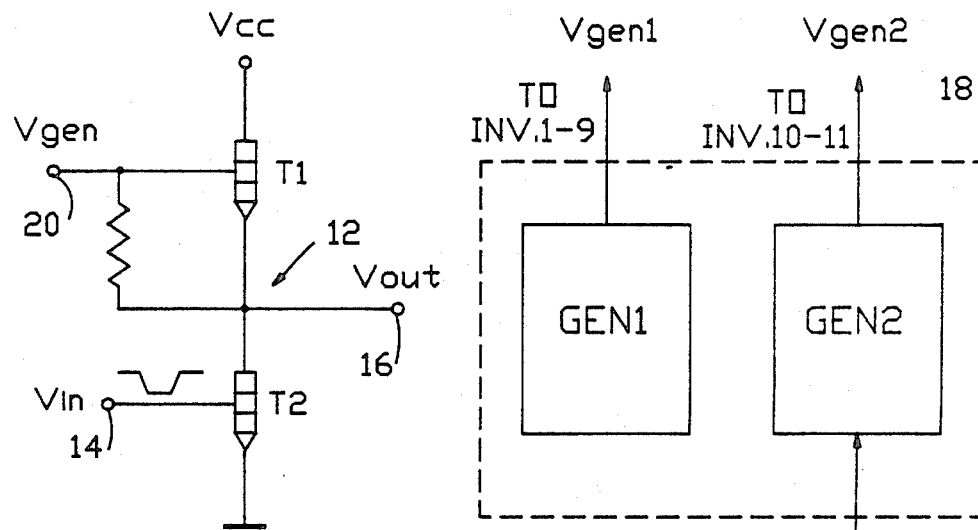
FIG.2
FIG.4

INTEGRATED HIGH GAIN VOLTAGE CONTROLLED OSCILLATOR

BACKGROUND OF THE INVENTION

The present invention relates generally to the field of oscillators and more particularly to voltage controlled oscillators of the type used, for example, in phase locked loop (PLL) circuits.

Voltage controlled oscillator (VCO) circuits produce output signals whose frequency varies as a function of an input control voltage. These circuits are widely used in systems employing PLL circuits as well as in any system where a variable frequency output signal is required as a function in an input signal.

In data communication systems PLL circuits have been employed for extracting clock information from a received signal which permits data processing systems at remote locations to operate synchronously. Examples of such applications are described in U.S. Pat. No. 4,131,861 to Malaviya entitled "Variable Frequency Oscillator System Including Two Matched Oscillators Controlled by a Phase Locked Loop," and U.S. Pat. No. 4,513,427 to Boriello et al. entitled "Data and Clock Recovery System for Data Communication Controller." VCOs in these applications preferably have a highly stable center frequency at or near the desired system clock frequency, and a high gain or change in output frequency for a given change in input voltage. Finally, it is particularly advantageous if the VCO can be integrated on the same chip with the PLL and other circuits in order to reduce the size, power requirements, delay and cost of the system.

Highly stable VCOs have been fabricated using inherently stable frequency-determining components such as varactor diodes, bulk crystal devices, and bulk and surface acoustic wave devices. A relatively high VCO gain (MHz/volt) can be achieved by means of operational amplifiers such as in U.S. Pat. No. 4,118,674, which employs a crystal oscillator. However, these components are not integratable on a chip with the other required components in a VCO or PLL.

Another VCO configuration used in prior systems employs cascaded inverters connected in a ring configuration to form a ring oscillator as described, for example, in U.S. Pat. No. 4,072,910 to Dingwall et al. entitled "Voltage Controlled Oscillator Having Equally Controlled Current Source and Current Sink." Other ring oscillator VCOs are described in U.S. Pat. Nos. 4,052,673 and 4,513,427. Such oscillators have the advantages of small size, low cost, a large tuning range and they are integratable. The maximum frequency of a ring oscillator is limited by the logic speed, i.e., the switching delay of the devices used to form the inverter circuits. U.S. Pat. No. 4,513,427, cited above, describes a ring oscillator VCO employing a tapped delay line. While the components are contained on a single integrated circuit chip, the oscillator frequency in the disclosed embodiment is on the order of 40 MHz. and the data transfer rate is 10 Mbits/sec. For much higher data rates, which necessitate even higher clock frequencies, the tapped delay line technique will not suffice.

In the case of data processing systems including communication links wherein the data transfer rates are on the order of several hundred Mbits/sec., a VCO having a center frequency of several hundred MHz. and a gain of at least 1 GHz./volt is required in order to achieve acceptable noise performance. Known VCO arrangements cannot achieve this performance with a circuit formed on a single integrated circuit chip.

SUMMARY OF THE INVENTION

It is therefore an object of the present invention to provide a voltage controlled oscillator capable of high frequency and high gain operation, with all of the components thereof integratable on a single integrated circuit chip.

Another object of the invention is to provide a VCO formed of a plurality of cascaded inverter circuits in a ring configuration wherein the center frequency and the gain of the VCO are selectable.

Still another object of the invention is to provide an integratable VCO useful in phased locked loop and other applications.

In accordance with one embodiment of the present invention a voltage controlled oscillator is formed of a plurality of cascaded inverter circuits in a ring configuration. Each inverter is a grounded emitter circuit having an active pull-up stage in order to achieve a short gate delay. The frequency of the ring oscillator is determined by the number of inverter stages, and the gain is selectable by coupling an external control voltage to only certain of the inverters. The VCO may be fabricated on a single integrated circuit along with the other circuits necessary to form a PLL, frequency synthesizer, or other such frequency generation system.

BRIEF DESCRIPTION OF THE DRAWINGS

Other objects and many of the attendant advantages of the present invention will be better understood by reference to the following detailed description in conjunction with the accompanying drawings, wherein:

FIG. 1 is a block diagram of a voltage controlled oscillator according to the present invention;

FIG. 2 is a schematic diagram of an inverter stage employed in the VCO of FIG. 1;

FIG. 4 is a simplified block diagram of an alternative VCO control voltage generator.

DETAILED DESCRIPTION OF THE PREFERRED EMBODIMENTS

Figure 3:
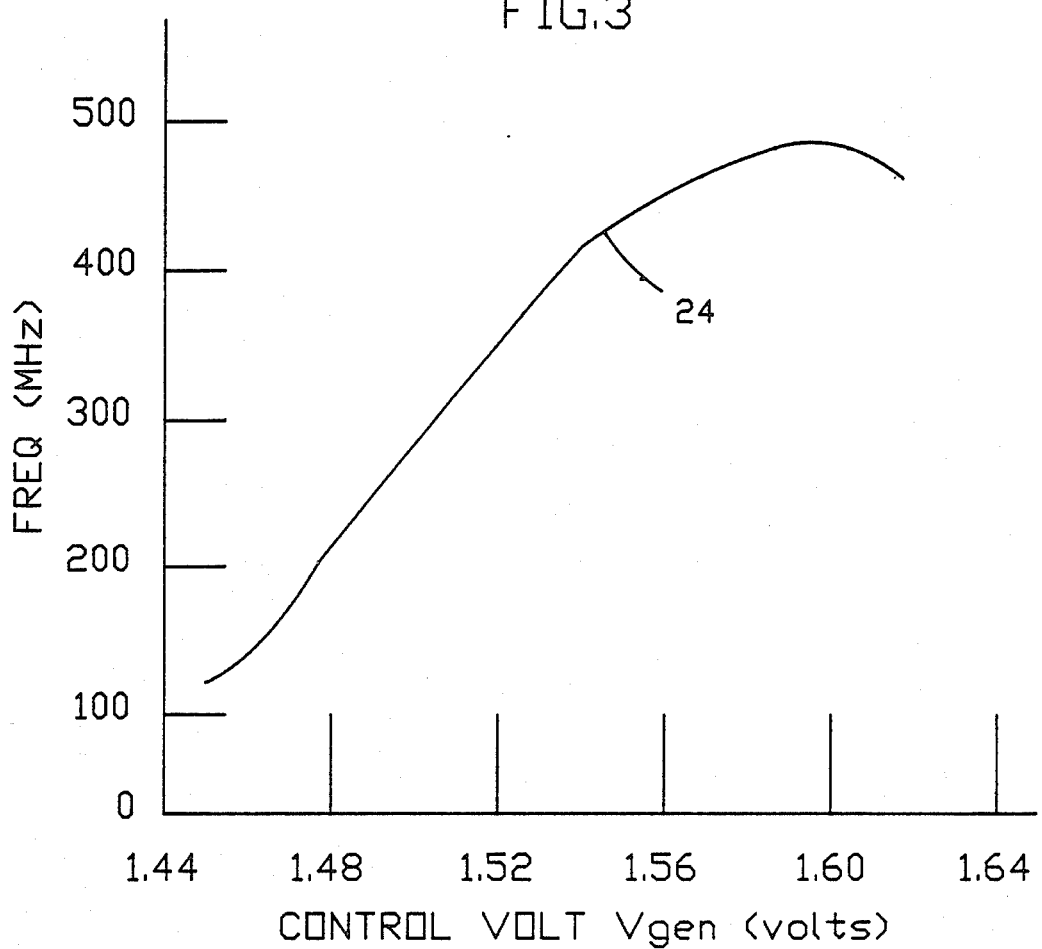
FIG. 3 is a graph showing the frequency of the VCO of FIG. 1 as a function of the control voltage.
Figure 5:
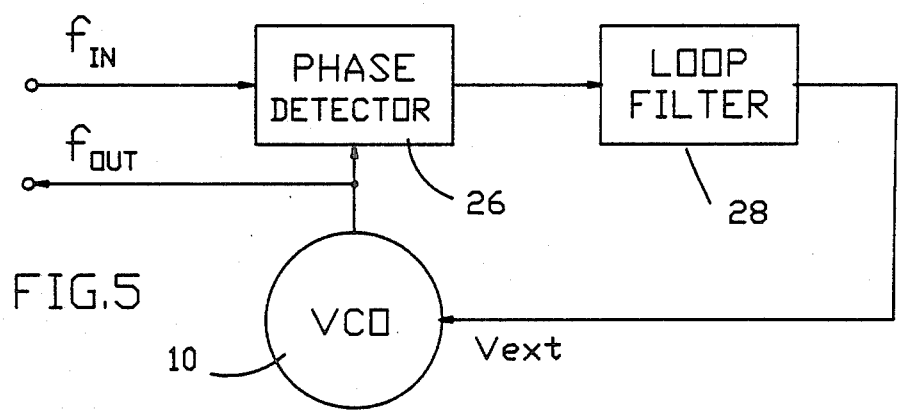
FIG. 5 is a block diagram of a phase locked loop system including the VCO of the present invention.

Referring now to the drawings, there is shown in FIG. 1 a VCO 10 according to one embodiment of the present invention. VCO 10 is formed of plurality of cascaded inverter stages 12 connected in a ring oscillator configuration, with each inverter 12 having an input 14 connected to the output 16 of the previous inverter stage 12. A VCO control voltage generator 18 has an output connected to a control input 20 of each inverter stage 12. The VCO generator 18 provides a control voltage signal which varies the frequency of VCO 10. The control voltage signal is comprised of a fixed bias to set the nominal operating frequency of VCO 10, and an external voltage signal $V_{ext}$ to vary the VCO frequency about the nominal frequency. The output $f_{out}$ a terminal 22 of VCO 10 may be taken across the input 14 and output 16 of any of the inverter stages 12. A differential current switch logic gate may be placed across terminal 22 to amplify the signal swing to achieve a greater noise margin. An eleven stage VCO is shown in FIG. 1 for illustrative purposes only. A greater or lesser number of stages can be used depending upon the desired center frequency of the VCO, as long as there is an odd number of stages. The VCO frequency f is determined by the expression $$f = \tfrac{1}{2}ND$$

where N is the number of stages and D is the average delay of each stage. Thus, as the delay is reduced the VCO frequency increases.

FIG. 2 shows a schematic diagram of one of the VCO inverter stages 12. Each stage 12 is a grounded emitter inverter with an active pull-up circuit. The input signal $V_{in}$ to the base of transistor T1 is the output from the previous inverter stage. The emitter of T1 is grounded and the collector of T1 is the output of inverter 12. The emitter of a pull-up transistor T2 is also connected to the collector of T1. The input signal $V_{gen}$ to the emitter of T2 at terminal 20 is the control voltage from VCO generator 18. The collector of T2 is connected to the system power supply $V_{CC}$, and a pull-up resistor $R_{pu}$ is connected between the base and emitter of T2.

In operation, the "up" level at the base of T1, i.e., the voltage when T1 is on, is the base-emitter voltage $V_{be}$ of T1 at its "on" current. This current is determined by $V_{gen}$ and $R_{pu}$. The "down" level at the base of T1 is $V_{gen} - V_{be}(T2)$ at a current that is the total of the current from the previous stage minus the current flowing in $R_{pu}$. Pull-up transistor T2 and resistor $R_{pu}$ contribute to the short delay of inverter 12 as follows. When inverter 12 is on current is flowing through both T1 and T2. When the input $V_{in}$ to T1 drops, turning off the current, the current in T2 will continue for some additional delay time determined by its base-emitter time constant. The emitter current of T2 flows directly into the base of T1 of the following stage, turning it on very quickly. The net effect of this delay between T1 and T2 is to provide an overshoot on the turn-on transient, causing a reduction in the rise time and delay of the following stage. A similar effect occurs during the turn-off of the following stage. The signal swing is on the order of about 100 mV. The delay is on the order of about about 100 ps., which is approximately five times faster than the delay of a differential current switch logic gate fabricated with the same devices. The up and down levels are both clamped, as shown by the input signal at the base of T1. Therefore, by adjusting the control voltage $V_{gen}$ very large changes in the oscillator current can be achieved. In this manner the power in the VCO 10 can be varied without adversely affecting the operation of the oscillator.

Referring to FIG. 3, there is shown a graphical representation 24 of the output frequency of an eleven stage VCO according to the present invention as a function of the control voltage $V_{gen}$. At a frequency of about 400 MHz. the VCO gain was about 4 GHz./volt. The gain of the VCO is expressed as $$(\Delta f / \Delta V) = 1/(2ND^2)(\Delta D / \Delta V)$$

where $\Delta f$ is the change in output frequency for a change in control voltage $V_{gen}$ of $\Delta V$, D is the average delay per stage, $\Delta D$ is the change in delay, and N is the number of stages in the VCO. Variation of the gain is due primarily to variation in the stage delay. The main source of delay variation is variation in the control voltage $V_{gen}$ relative to the base-emitter voltage $V_{be}$ of T2. The nominal value of $V_{gen}$ is $V_{be1}(off) - V_{be2}(on)$.

FIG. 4 shows an alternative arrangement of the control voltage generator 18 of FIG. 1, wherein the VCO gain can be adjusted. Rather than applying the same control voltage $V_{gen}$ to all of the inverter stages 12 as in FIG. 1, the control signal is divided into two components by means of generators GEN1 and GEN2. Generator GEN1 supplies a fixed bias voltage $V_{gen1}$ to selected inverter stages, for example, stages 1–9, while generator GEN2 supplies a control voltage signal $V_{gen2}$ to the remaining stages 10 and 11. Signal $V_{gen2}$ is a combination of a fixed bias and an external control signal $V_{ext}$. In this example, the VCO gain is 2/11 of the gain of the VCO shown in FIG. 1. Other VCO gains may be selected in a similar manner.

The VCO of the present invention may be employed, for example, in a PLL circuit such as the one shown in FIG. 4. A typical PLL includes a phase detector 26, a low pass loop filter 28 and a VCO 10. In clock extraction applications $f_{IN}$ is the incoming data stream and $f_{OUT}$ is the clock signal recovered or extracted from the data stream. The operation of PLLs is well known in the art and need not be described in detail. As the PLL input frequency $f_{in}$ is increased, a higher gain is required in order to achieve acceptable performance and noise margins. Prior systems could achieve the required frequencies only with VCOs including discrete components such as varactor diodes or surface acoustic wave devices. Even then, the VCO gains were unacceptably low for certain applications. Further, such components are relatively expensive and cannot be integrated on a chip with the other VCO and PLL components. Although the present VCO is illustrated in a PLL application, it may be employed in any application requiring such an oscillator.

The present invention thus provides a high frequency, high gain VCO having a selectable gain and frequency, wherein the VCO is integratable on a single integrated circuit chip.

While the invention has been shown and described with reference to particular embodiments thereof, it will be understood by those skilled in the art having the benefit of the foregoing detailed description that various changes in form and details may be made without departing from the spirit and scope of the invention as set forth in claims.

What is claimed is:

1. A voltage controlled oscillator comprising:
    a plurality of inverter stages connected in a ring configuration, each said inverter stage having an input terminal and an output terminal with the input terminal of each said stage being connected to the output terminal of the next preceding stage, each said inverter stage comprising:
    first and second transistors each having an emitter, a base and a collector, wherein the base of said first transistor is the inverter stage input terminal and the collector of said first transistor is the inverter stage output terminal, the emitter of said second transistor being connected to the collector of said first transistor, the collector of said second transistor being connected to a first power supply terminal and the emitter of said first transistor being connected to a second power supply terminal, and
    a resistor connected between the base and the emitter of said second transistor;

generator means connected to the base of said second transistor is each of said inverter stages for providing a control voltage thereto; and oscillator output terminals connected between the input and output terminals of one of said plurality of inverter stages.

2. The voltage controlled oscillator of claim 1, wherein said second power supply terminal is grounded.

3. The voltage controlled oscillator of claim 1, wherein said plurality of inverter stages and said generator means are formed on a single integrated circuit chip.

4. The voltage controlled oscillator of claim 1, wherein said generator means comprises:
   a fixed control voltage generator for applying a fixed bias voltage to selected of said inverter stages; and
   a variable control voltage generator for applying to the remainder of said inverter stages a signal formed of said fixed bias voltage and a variable control voltage.

5. The voltage controlled oscillator of claim 1, wherein the gain of said oscillator is at least about 1 GHz./volt.

6. A phase locked loop system comprising:
   input and output terminals;
   phase detector means connected to said input terminal;
   filter means connected to an output of said phase detector means;
   voltage controlled oscillator means connected to an output of said filter means and an input of said phase detector means, said voltage controlled oscillator comprising:
      a plurality of inverter stages connected in a ring configuration, each said inverter stage having an input terminal and an output terminal with the input terminal of each said stage being connected to the output terminal of the next preceding stage, each said inverter stage comprising:
      first and second transistors each having an emitter, a base and a collector, wherein the base of said first transistor is the inverter stage input terminal and the collector of said first transistor is the inverter stage output terminal, the emitter of said second transistor being connected to the collector of said first transistor, the collector of said second transistor being connected to a first power supply terminal and the emitter of said first transistor being connected to a second power supply terminal, and
      a resistor connected between the base and the emitter of said second transistor;
   generator means connected to the base of said second transistor in each of said inverter stages for providing a control voltage thereto; and oscillator output terminals connected between the input and output terminals of one of said plurality of inverter stages.

7. The phase locked loop system of claim 6, wherein said second power supply terminal is grounded.

8. The phase locked loop system of claim 6, wherein said plurality of inverter stages and said generator means are formed on a single integrated circuit chip.

9. The phase locked loop system of claim 6, wherein the gain of said voltage controlled oscillator is at least about 1 GHz./volt.

10. The phase locked loop system of claim 6, wherein said generator means comprises:
   a fixed control voltage generator for applying a fixed bias voltage to selected of said inverter stages; and
   a variable control voltage generator for applying to the remainder of said inverter stages a signal formed of said fixed bias voltage and a variable control voltage.

* * * * *

UNITED STATES PATENT AND TRADEMARK OFFICE
CERTIFICATE OF CORRECTION

PATENT NO.   : 4,694,261

DATED        : September 15, 1987

INVENTOR(S)  : J.F. Ewen and J.M. Mosley

It is certified that error appears in the above-identified patent and that said Letters Patent is hereby corrected as shown below:

Column 5, line 2, after "transistor", the word should be

--in--, not "is"

Signed and Sealed this

Fifth Day of April, 1988

*Attest:*

DONALD J. QUIGG

*Attesting Officer*     *Commissioner of Patents and Trademarks*